(12) United States Patent
Kawata

(10) Patent No.: US 9,190,575 B2
(45) Date of Patent: Nov. 17, 2015

(54) METHOD OF MANUFACTURING DISPLAY DEVICE

(71) Applicant: Japan Display Inc., Minato-ku (JP)

(72) Inventor: Yasushi Kawata, Ageo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 14/025,973

(22) Filed: Sep. 13, 2013

(65) Prior Publication Data

US 2014/0093988 A1   Apr. 3, 2014

(30) Foreign Application Priority Data

Oct. 3, 2012   (JP) ................................ 2012-221177

(51) Int. Cl.
| | | |
|---|---|---|
| *H01L 21/00* | (2006.01) | |
| *H01L 33/48* | (2010.01) | |
| *H01L 27/32* | (2006.01) | |

(52) U.S. Cl.
CPC .............. *H01L 33/48* (2013.01); *H01L 27/322* (2013.01); *H01L 2227/326* (2013.01)

(58) Field of Classification Search
CPC ... H01L 33/48; H01L 2227/326; B32B 38/10; B32B 38/0008; G02F 1/13; H05B 33/101
USPC ............................................. 438/27; 156/155
See application file for complete search history.

(56) References Cited

U.S. PATENT DOCUMENTS

| | | | | |
|---|---|---|---|---|
| 6,020,867 | A | * | 2/2000 | Shimada et al. ................ 345/87 |
| 2011/0026236 | A1 | * | 2/2011 | Kondo et al. ................. 361/820 |
| 2014/0190621 | A1 | * | 7/2014 | Kawata et al. ................ 156/155 |

FOREIGN PATENT DOCUMENTS

| | | | |
|---|---|---|---|
| CN | 1883061 A | | 12/2006 |
| CN | 101578916 A | | 11/2009 |
| JP | 2012-27177 | | 2/2012 |
| JP | 2012027177 A | * | 2/2012 |
| WO | WO 2007/046656 A1 | | 4/2007 |

OTHER PUBLICATIONS

French et al., Thin Plastic Electrophoretic Displays Fabricated by a Novel Process, 2005, SID 05 Digest, pp. 1634-1637.*
U.S. Appl. No. 14/139,997, filed Dec. 24, 2013, Kawata, et al.
U.S. Appl. No. 14/285,705, filed May 23, 2014, Kawata.
Office Action issued Jun. 17, 2015 in Chinese Patent Application No. 201310461786.2 (with English translation).

* cited by examiner

*Primary Examiner* — Reema Patel
*Assistant Examiner* — Syed Gheyas
(74) *Attorney, Agent, or Firm* — Oblon, McClelland, Maier & Neustadt, L.L.P.

(57) ABSTRACT

According to one embodiment, a method of manufacturing a display device, includes preparing a first substrate configured such that a first display element module is formed on a first glass substrate, preparing a second substrate configured such that a first peeling auxiliary layer is formed on a second glass substrate, and then a first color filter layer is formed on the first peeling auxiliary layer, attaching the first display element module and the first color filter layer, and peeling the second glass substrate from the first peeling auxiliary layer.

7 Claims, 7 Drawing Sheets

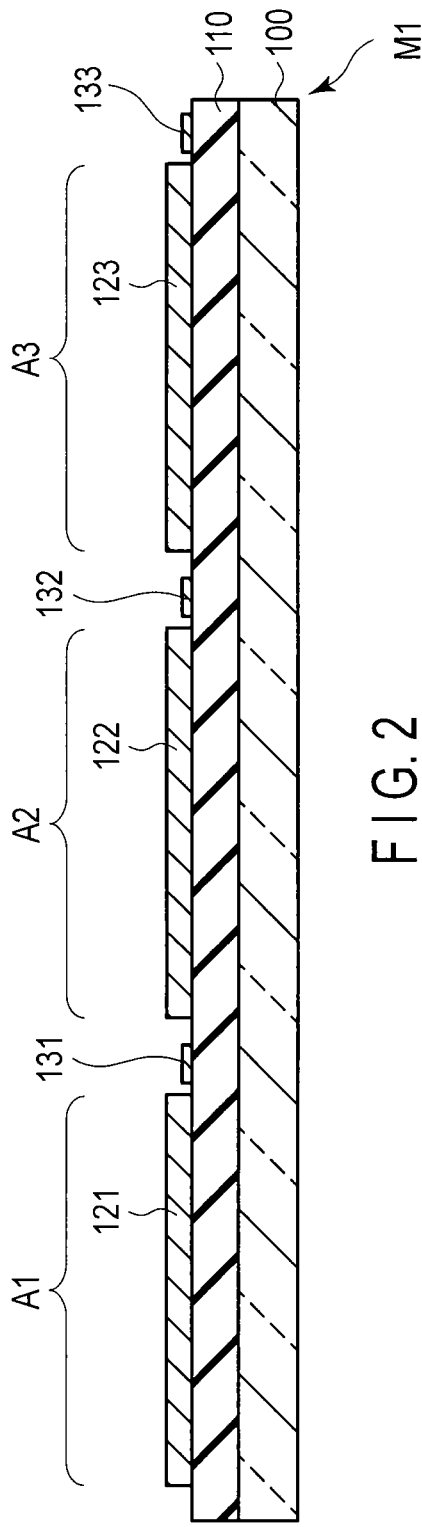
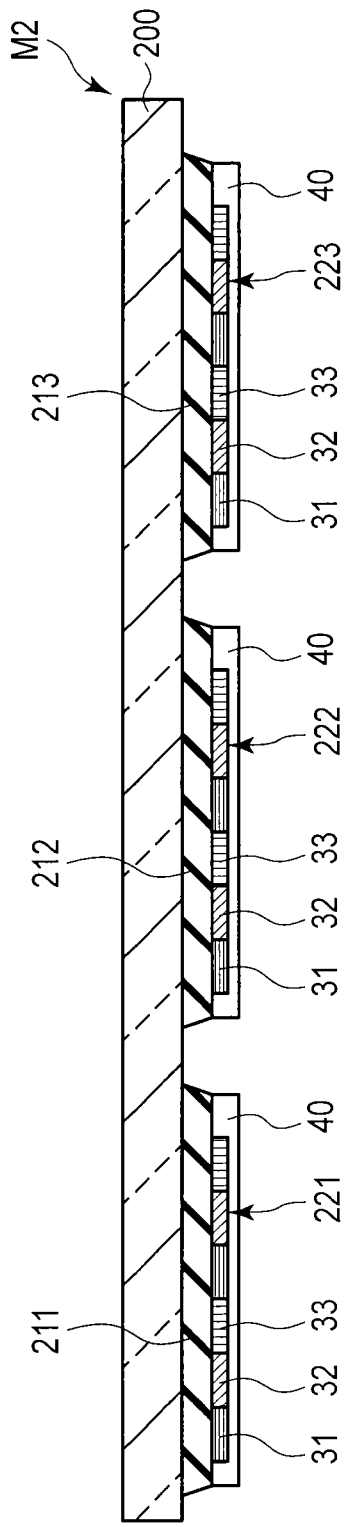

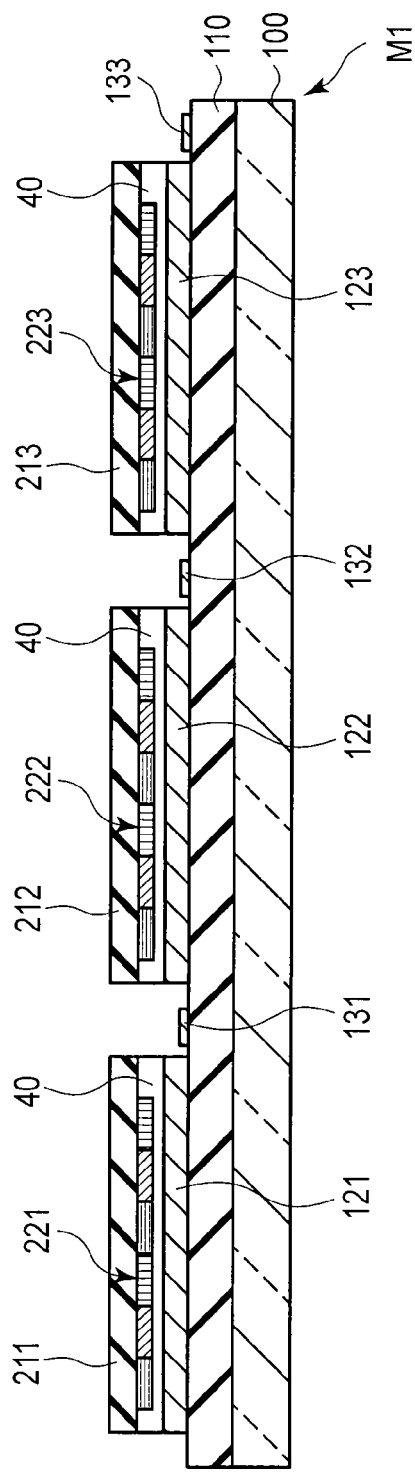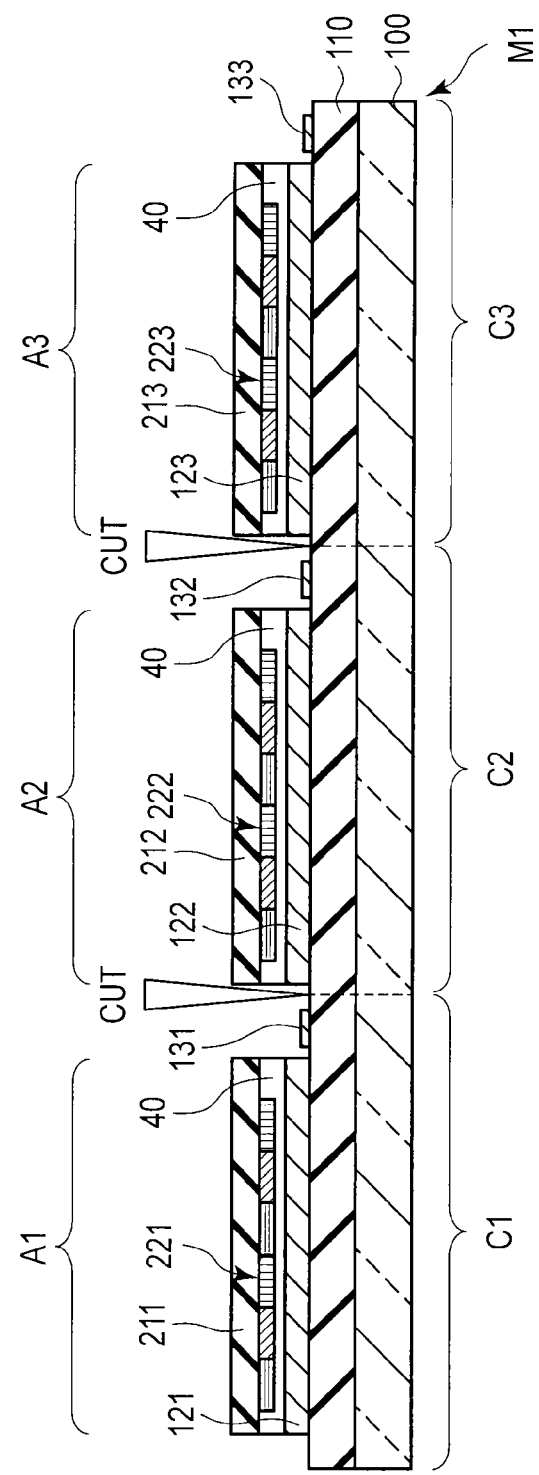

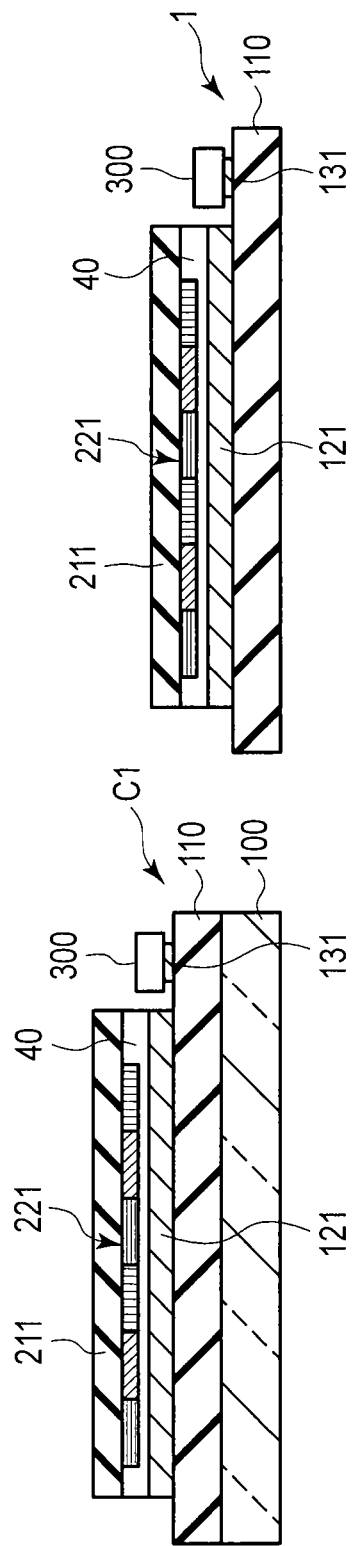
FIG. 8
FIG. 9
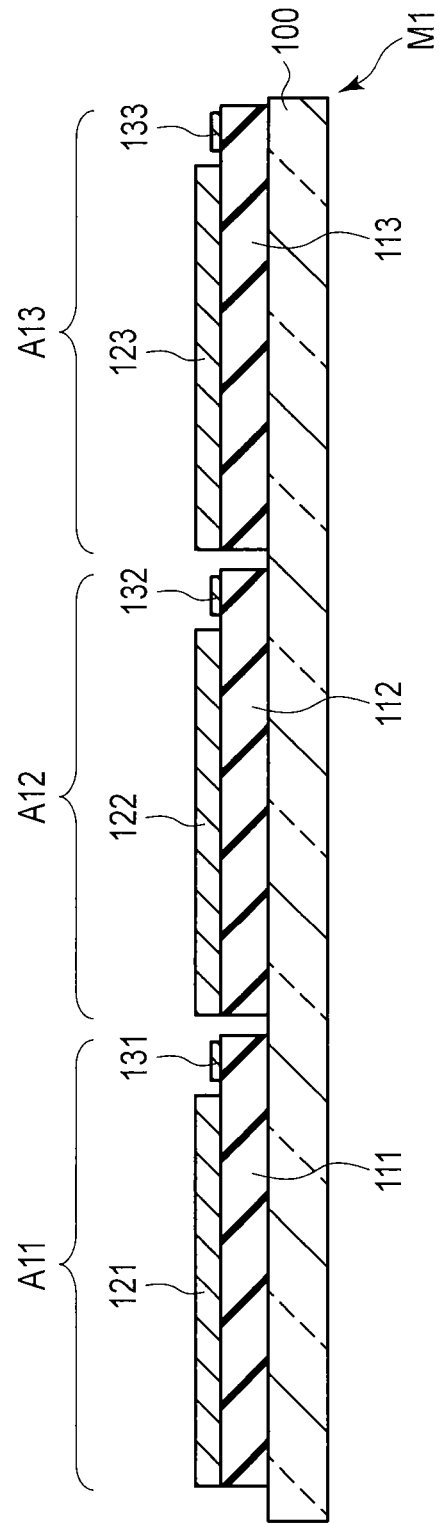
FIG. 10

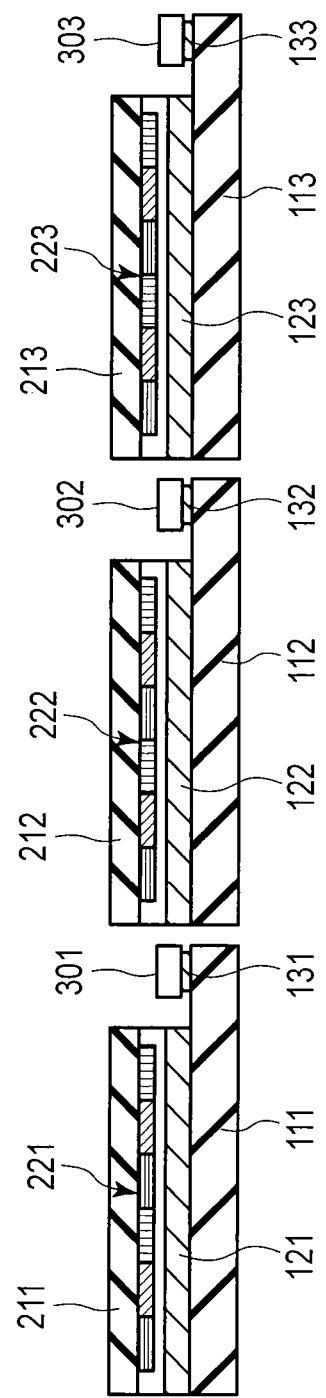
F I G. 13

METHOD OF MANUFACTURING DISPLAY DEVICE

CROSS-REFERENCE TO RELATED APPLICATIONS

This application is based upon and claims the benefit of priority from Japanese Patent Application No. 2012-221177, filed Oct. 3, 2012, the entire contents of which are incorporated herein by reference.

FIELD

Embodiments described herein relate generally to a method of manufacturing a display device.

BACKGROUND

By virtue of such advantageous features as light weight, small thickness and low power consumption, flat-panel display devices, such as an organic electroluminescence (EL) display device and a liquid crystal display device, have been used in various fields of OA equipment, information terminals, timepieces, and televisions. In particular, by virtue of high responsivity, display devices using thin-film transistors (TFTs) are widely used as monitors of mobile terminals, computers, etc., which display a great deal of information.

In recent years, as regards mobile information terminal devices such as mobile phones and PDAs (personal digital assistants), there has been an increasing demand for a display device having a less thickness and a less weight, from the standpoint of design and portability, as well as performance. For example, display devices, which realize thinner structures, have been proposed. As a method of realizing a less thickness and less weight, there is a technique wherein a glass substrate is replaced with a resin layer of, e.g. polyimide with a relatively high heat resistance, and the resin layer is formed on a glass substrate. After TFTs, etc. are formed on the resin layer, the resultant structure is divided into cells, and at last the resin layer is peeled from the glass substrate.

In this process, however, when many panels are assembled batchwise by using mother glass substrates and then the assembled body is separated into individual panels, it is necessary to cut the resin layer together with both attached mother glass substrates, and this makes it difficult to take out electrodes for mounting signal supply sources which are necessary for displaying images on the panels. This being the case, there has been a demand for an improvement in productivity.

BRIEF DESCRIPTION OF THE DRAWINGS

FIG. 2 is a view for describing a method of manufacturing the display device shown in FIG. 1, FIG. 2 illustrating a step of preparing a first mother substrate.

FIG. 3 is a view for describing the method of manufacturing the display device shown in FIG. 1, FIG. 3 illustrating a step of preparing a second mother substrate.

FIG. 6 is a view for describing the method of manufacturing the display device shown in FIG. 1, FIG. 6 illustrating a step of peeling a glass substrate of the second mother substrate.

FIG. 7 is a view for describing the method of manufacturing the display device shown in FIG. 1, FIG. 7 illustrating a step of cutting the first mother substrate.

FIG. 8 is a view for describing the method of manufacturing the display device shown in FIG. 1, FIG. 8 illustrating a step of mounting a signal supply source on a cut chip.

FIG. 9 is a view for describing the method of manufacturing the display device shown in FIG. 1, FIG. 9 illustrating a step of peeling a glass substrate of the first mother substrate.

FIG. 10 is a view for describing another method of manufacturing the display device shown in FIG. 1, FIG. 10 illustrating a step of preparing a first mother substrate.

FIG. 13 is a view for describing the another method of manufacturing the display device shown in FIG. 1, FIG. 13 illustrating a step of peeling a glass substrate of the first mother substrate.

DETAILED DESCRIPTION

Figure 1:
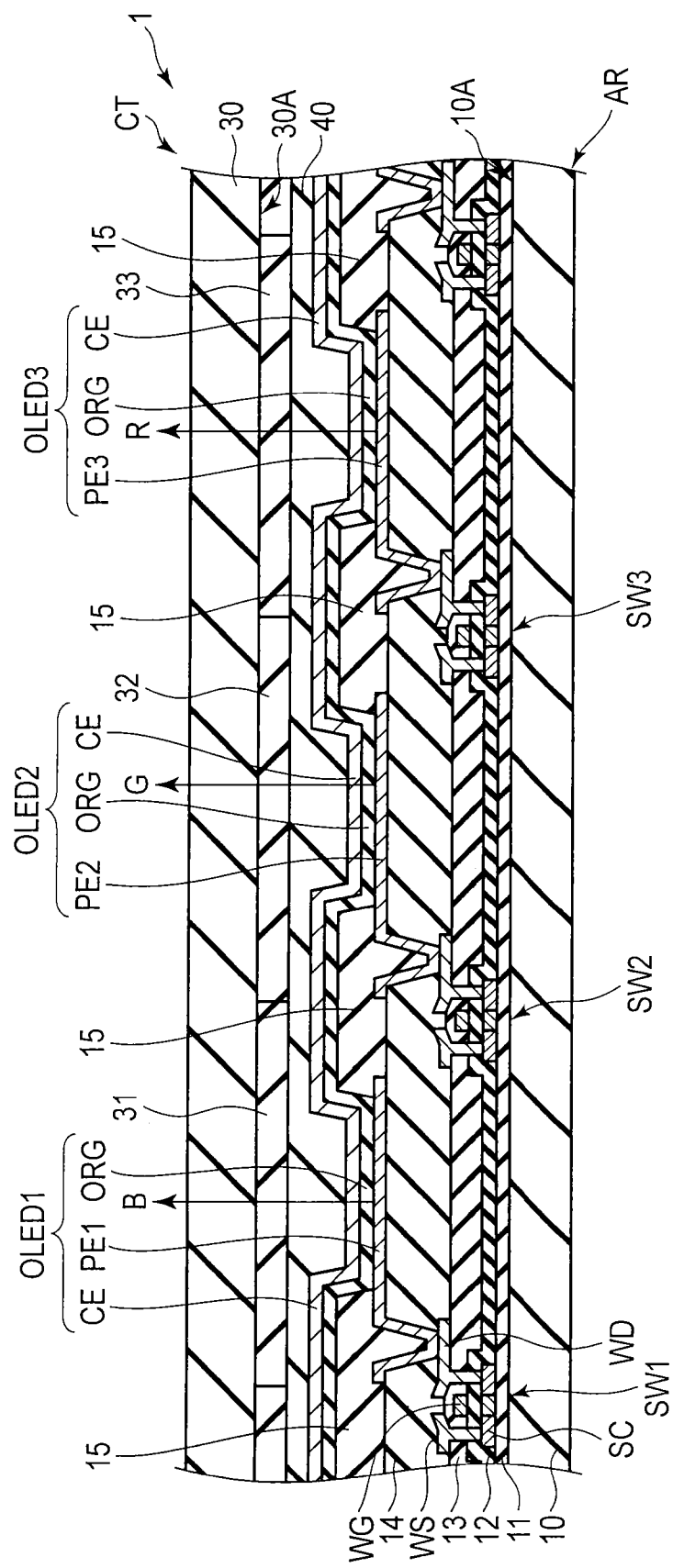
FIG. 1 is a view which schematically illustrates a cross-sectional structure of a display device according to an embodiment.

In general, according to one embodiment, a method of manufacturing a display device, includes: preparing a first substrate configured such that a first display element module comprising a plurality of display elements is formed in a first region on a first glass substrate and a second display element module comprising a plurality of display elements is formed in a second region on the first glass substrate, the second region being spaced apart from the first region; preparing a second substrate configured such that a first peeling auxiliary layer having an island shape is formed on a second glass substrate, a second peeling auxiliary layer having an island shape, which is spaced apart from the first peeling auxiliary layer, is formed on the second glass substrate, and then a first color filter layer is formed on the first peeling auxiliary layer and a second color filter layer is formed on the second peeling auxiliary layer; attaching the first display element module and the first color filter layer, and attaching the second display element module and the second color filter layer; peeling the second glass substrate from the first peeling auxiliary layer and the second peeling auxiliary layer by radiating a laser beam toward the second substrate; and cutting the first substrate between the first region and the second region.

According to another embodiment, a method of manufacturing a display device, includes: preparing a first substrate configured such that a first peeling auxiliary layer having an island shape is formed on a first glass substrate, a second peeling auxiliary layer having an island shape, which is spaced apart from the first peeling auxiliary layer, is formed on the first glass substrate, and then a first display element module comprising a plurality of display elements is formed on the first peeling auxiliary layer and a second display element module comprising a plurality of display elements is formed on the second peeling auxiliary layer; preparing a second substrate configured such that a third peeling auxiliary layer having an island shape is formed on a second glass substrate, a fourth peeling auxiliary layer having an island shape, which is spaced apart from the third peeling auxiliary layer, is formed on the second glass substrate, and then a first color filter layer is formed on the third peeling auxiliary layer and a second color filter layer is formed on the fourth peeling auxiliary layer; attaching the first display element module and the first color filter layer, and attaching the second display element module and the second color filter layer; peeling the second glass substrate from the third peeling auxiliary layer and the fourth peeling auxiliary layer by radiating a laser beam toward the second substrate; and peeling the first glass substrate from the first peeling auxiliary layer and the second peeling auxiliary layer by radiating a laser beam toward the first substrate.

Embodiments will now be described in detail with reference to the accompanying drawings. In the drawings, structural elements having the same or similar functions are denoted by like reference numerals, and an overlapping description is omitted.

FIG. 1 is a view which schematically illustrates a cross-sectional structure of a display device according to an embodiment. A description is given of a cross-sectional structure of an organic EL display device as an example of a sheet-shaped display device.

The illustrated organic EL display device 1 adopts an active matrix driving method, and includes an array substrate AR and a counter-substrate CT. The array substrate AR is formed by using a resin substrate 10. The array substrate AR includes switching elements SW1 to SW3 and organic EL elements OLED1 to OLED3 on an inner surface 10A side of the resin substrate 10.

The resin substrate 10 is an insulative substrate, which is formed of, for example, a material consisting mainly of polyimide (PI). The resin substrate 10 has a thickness of, e.g. 5 to 30 μm. It is preferable to use, as the material of the resin substrate 10, a material with a high heat resistance, such as polyimide, polyamide-imide, or polyaramide.

The inner surface 10A of the resin substrate 10 is covered with a first insulation film 11. The first insulation film 11 functions as an inner surface barrier film for suppressing entrance of ionic impurities from the resin substrate 10 or entrance of moisture via the resin substrate 10. The first insulation film 11 is formed of an inorganic material such as silicon nitride (SiN), silicon oxide (SiO) or silicon oxynitride (SiON), and is composed of a single layer or a multilayer. Incidentally, the first insulation film 11 may be formed of some other material which has a barrier capability and can ensure transparency. In addition, when another insulation film, which is located on the inner surface 10A side of the resin substrate 10, functions as a barrier film, the first insulation film 11 may be omitted.

The switching elements SW1 to SW3 are formed on the first insulation film 11. These switching elements SW1 to SW3 are, for example, thin-film transistors (TFTs) each including a semiconductor layer SC. The switching elements SW1 to SW3 have the same structure. In the description below, attention is paid to the switching element SW1, and the structure thereof is described more specifically.

In the example illustrated, the switching element SW1 may be of a top gate type or a bottom gate type. The semiconductor layer SC may be, for example, amorphous silicon or polysilicon, or may be an oxide semiconductor formed of an oxide including at least one of indium (In), gallium (Ga) and zinc (Zn). The oxide semiconductor can be formed in a process at lower temperatures than the amorphous silicon or polysilicon. In particular, an oxide semiconductor, such as IGZO, is preferable in that the investment cost of manufacturing equipment can be reduced since a manufacturing apparatus, which is used for fabricating thin-film transistors including amorphous silicon semiconductor layers, can also be used as such.

The semiconductor layer SC is formed on the first insulation film 11, and is covered with a second insulation film 12. The second insulation film 12 is also disposed on the first insulation film 11. A gate electrode WG of the switching element SW1 is formed on the second insulation film 12. The gate electrode WG is covered with a third insulation film 13. The third insulation film 13 is also disposed on the second insulation film 12.

A source electrode WS and a drain electrode WD of the switching element SW1 are formed on the third insulation film 13. The source electrode WS and drain electrode WD are put in contact with the semiconductor layer SC. The source electrode WS and drain electrode WD are covered with a fourth insulation film 14. The fourth insulation film 14 is also disposed on the third insulation film 13.

The organic EL elements OLED1 to OLED3 are formed on the fourth insulation film 14. In the example illustrated, the organic EL element OLED1 is electrically connected to the switching element SW1, the organic EL element OLED2 is electrically connected to the switching element SW2, and the organic EL element OLED3 is electrically connected to the switching element SW3.

The color of emission light of each of the organic EL elements OLED1 to OLED3 is white. In addition, each of the organic EL elements OLED1 to OLED3 is configured as a top emission type which emits light toward the counter-substrate CT. The organic EL elements OLED1 to OLED3 have the same structure.

The organic EL element OLED1 includes an anode PE1 which is formed on the fourth insulation film 14. The anode PE1 is in contact with the drain electrode WD of the switching element SW1 and is electrically connected to the switching element SW1. Similarly, the organic EL element OLED2 includes an anode PE2 which is electrically connected to the switching element SW2, and the organic EL element OLED3 includes an anode PE3 which is electrically connected to the switching element SW3. The anodes PE1 to PE3 may be formed of a transparent, electrically conducive material such as indium tin oxide (ITO) or indium zinc oxide (IZO), or may be formed of a metallic material such as aluminum (Al), magnesium (Mg), silver (Ag), titanium (Ti), or an alloy thereof. In the case of the top emission type, it is desirable that the anodes PE1 to PE3 be formed of a metallic material with a high reflectivity.

The organic EL elements OLED1 to OLED3 further include an organic light emission layer ORG and a cathode CE. The organic light emission layer ORG is located on the anodes PE1 to PE3. The organic light emission layer ORG is continuously formed, without a break, over the organic EL elements OLED1 to OLED3. The cathode CE is located on the organic light emission layer ORG. In addition, the cathode CE is continuously formed, without a break, over the organic EL elements OLED1 to OLED3. The cathode CE is formed of, for example, a transparent, electrically conductive material such as ITO or IZO.

Specifically, the organic EL element OLED1 is composed of the anode PE1, organic light emission layer ORG and cathode CE. Similarly, the organic EL element OLED2 is composed of the anode PE2, organic light emission layer ORG and cathode CE, and the organic EL element OLED3 is composed of the anode PE3, organic light emission layer ORG and cathode CE.

In the organic EL elements OLED1 to OLED3, a hole injection layer or a hole transport layer may be further provided between each of the anodes PE1 to PE3 and the organic light emission layer ORG, and an electron injection layer or an electron transport layer may be further provided between the organic light emission layer ORG and the cathode CE.

The organic EL elements OLED1 to OLED3 are partitioned by ribs 15. The ribs 15 are formed on the fourth insulation film 14 and cover the edges of the anodes PE1 to PE3. Although not described in detail, the ribs 15 are formed, for example, in a grid shape or in a stripe shape on the fourth insulation film 14. The ribs 15 are covered with the organic light emission layer ORG. Specifically, the organic light emission layer ORG extends over not only the anodes PE1 to PE3 but also over the ribs 15.

The counter-substrate CT is formed by using a transparent resin substrate 30. The counter-substrate CT includes a first color filter 31, a second color filter 32 and a third color filter 33 on an inner surface 30A side of the resin substrate 30.

The resin substrate 30 is a transparent insulative substrate, which is formed of, for example, a material consisting mainly of polyimide (PI). The resin substrate 30 has a thickness of, e.g. 5 to 30 µm. As the material of the resin substrate 30, the same material as the resin substrate 10 is applicable. In particular, since light emitted from the top-emission type organic EL elements OLED1 to OLED3 passes through the resin substrate 30, it is desirable that the resin substrate 30 be formed of a material with high transparency.

The first color filter 31 is opposed to the organic EL element OLED1 and passes a light component of a blue wavelength of white light. The second color filter 32 is opposed to the organic EL element OLED2 and passes a light component of a green wavelength of white light. The third color filter 33 is opposed to the organic EL element OLED3 and passes a light component of a red wavelength of white light. A boundary between the first color filter 31 and second color filter 32, a boundary between the second color filter 32 and third color filter 33 and a boundary between the first color filter 31 and third color filter 33 are located above the ribs 15.

The array substrate AR and counter-substrate CT are attached by a transparent adhesive 40. Specifically, the adhesive 40 is interposed between the organic EL element OLED1 and first color filter 31, between the organic EL element OLED2 and second color filter 32 and between the organic EL element OLED3 and third color filter 33. In the meantime, a barrier film (sealing film), which protects the organic EL elements OLED1 to OLED3 from contaminants such as moisture, oxygen and hydrogen, may be disposed between the cathode CE and the adhesive 40.

According to the organic EL display device 1, when each of the organic EL elements OLED1 to OLED3 has emitted light, this radiated light (white light) is emitted to the outside via the first color filter 31, second color filter 32 or third color filter 33. At this time, a light component of a blue wavelength of the white light, which has been radiated from the organic EL element OLED1, passes through the first color filter 31. In addition, a light component of a green wavelength of the white light, which has been radiated from the organic EL element OLED2, passes through the second color filter 32. A light component of a red wavelength of the white light, which has been radiated from the organic EL element OLED3, passes through the third color filter 33. Thereby, color display is realized.

Next, a description is given of an example of a method of manufacturing the organic EL display device 1 according to the embodiment.

To begin with, as illustrated in FIG. 2, a first mother substrate $M_1$ is prepared. Specifically, a film of a polyimide precursor compound with a thickness of 5 to 30 µm is formed on a glass substrate 100 which is formed of no-alkali glass, by using a film-forming device such as a slit coater. Then, this film is cured by heat treatment, and a transparent peeling auxiliary layer 110 is formed. This peeling auxiliary layer 110 is continuously formed over a first region A1, a second region A2 and a third region A3. The peeling auxiliary layer 110 corresponds to the above-described resin substrate 10.

Subsequently, a display element module 121 is formed in the first region A1 on the peeling auxiliary layer 110, a display element module 122 is formed in the second region A2 on the peeling auxiliary layer 110, and a display element module 123 is formed in the third region A3 on the peeling auxiliary layer 110. The first region A1, second region A2 and third region A3 are spaced apart from each other. In addition, mounting portions 131 to 133 for mounting signal supply sources, such as driving IC chips or flexible printed circuit boards, are formed on the peeling auxiliary layer 110. The display element modules 121 to 123 have the same structure and are composed of a plurality of organic EL elements which are arranged in a matrix. Besides, the mounting portions 131 to 133 have the same structure.

The display element modules 121 to 123 are formed in the following manner. As illustrated in FIG. 1, the first insulation film 11 is formed on the peeling auxiliary layer 110, and the switching elements SW1 to SW3, second insulation film 12, third insulation film 13 and fourth insulation film 14 are formed on the first insulation film 11. At the same time, various wirings are formed. The wiring is formed by using a general wiring material such as aluminum (Al), molybdenum (Mo), tungsten (Ta), copper (Cu) or titanium (Ti). The organic EL elements OLED1 to OLED3 are formed on the fourth insulation film 14. Specifically, the transparent electrodes (anodes) PE1 to PE3 are formed on the fourth insulation film 14, and then the ribs 15 are formed. Thereafter, the organic light emission layer ORG and reflective electrode (cathode) CE are successively formed. Then, where necessary, a sealing film is formed on the organic EL elements OLED1 to OLED3.

Figure 4:
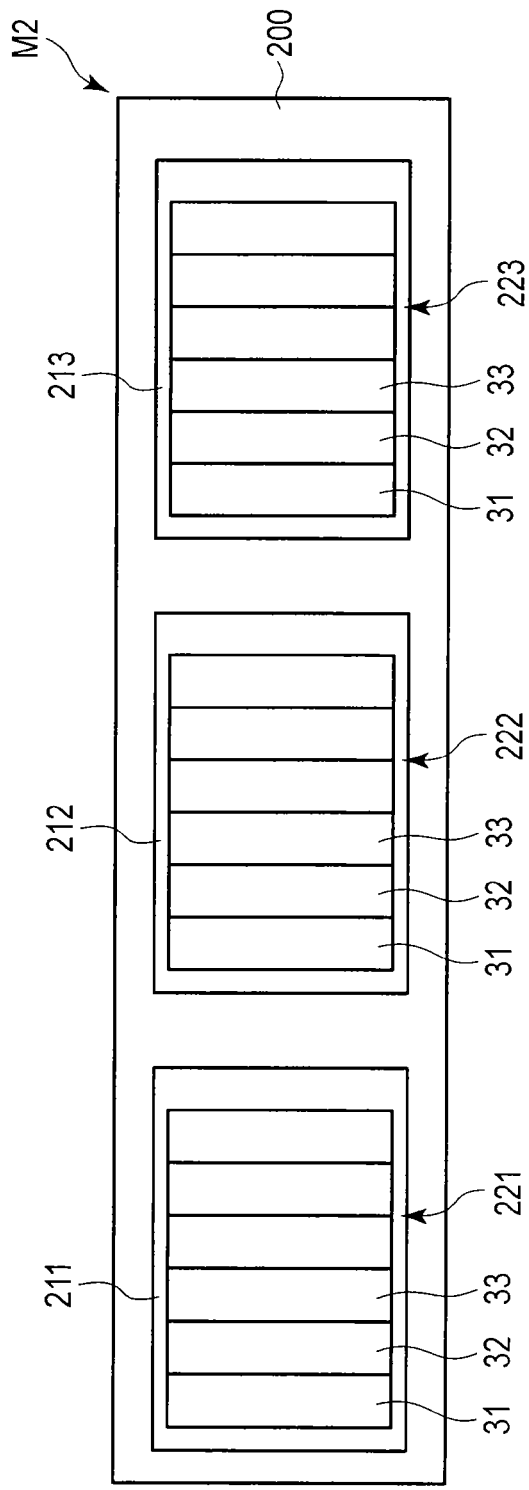
FIG. 4 is a schematic plan view of the second mother substrate shown in FIG. 3.

Subsequently, as illustrated in FIG. 3 and FIG. 4, a second mother substrate M2 is prepared. Specifically, a film of a polyimide precursor compound with a thickness of 5 to 30 µm is formed on a glass substrate 200 which is formed of no-alkali glass, by using a film-forming device such as a slit coater. Then, this film is cured by heat treatment and then patterned by using a photolithography process. Thereby, transparent peeling auxiliary layers 211 to 213 are formed. These peeling auxiliary layers 211 to 213 correspond to the above-described resin substrate 30. The peeling auxiliary layers 211 to 213 are formed to be opposed to the first region A1, second region A2 and third region A3, and are spaced apart from each other. Specifically, each of the peeling auxiliary layers 211 to 213 is formed in an island shape on the glass substrate 200. In other words, each of the peeling auxiliary layers 211 to 213 is patterned to have the same size as the resin substrate 30 of the organic EL display device that is a final product.

The end faces of each of the thus patterned peeling auxiliary layers 211 to 213 have shapes which are different from the shapes of end faces which are cut by blades such as cutters or the shapes of end faces which are cut by laser irradiation, and these peeling auxiliary layers 211 to 213 have tapered end faces. For example, the end faces of the peeling auxiliary layer 211 are not perpendicular to the major surface of the glass substrate 200, and have a tapered shape with a width gradually decreasing away from the glass substrate 200.

A color filter layer 221 is formed on the peeling auxiliary layer 211, a color filter layer 222 is formed on the peeling auxiliary layer 212, and a color filter layer 223 is formed on the peeling auxiliary layer 213. The color filer layers 221 to 223 have the same structure, and each of the color filer layers 221 to 223 includes the first color filter 31, second color filter 32 and third color filter 33. Each of the first color filter 31, second color filter 32 and third color filter 33 is formed in a stripe shape, and the first color filter 31, second color filter 32 and third color filter 33 are cyclically arranged in the named order. The adhesive 40 is coated on the surfaces of the color filer layers 221 to 223.

Figure 5:
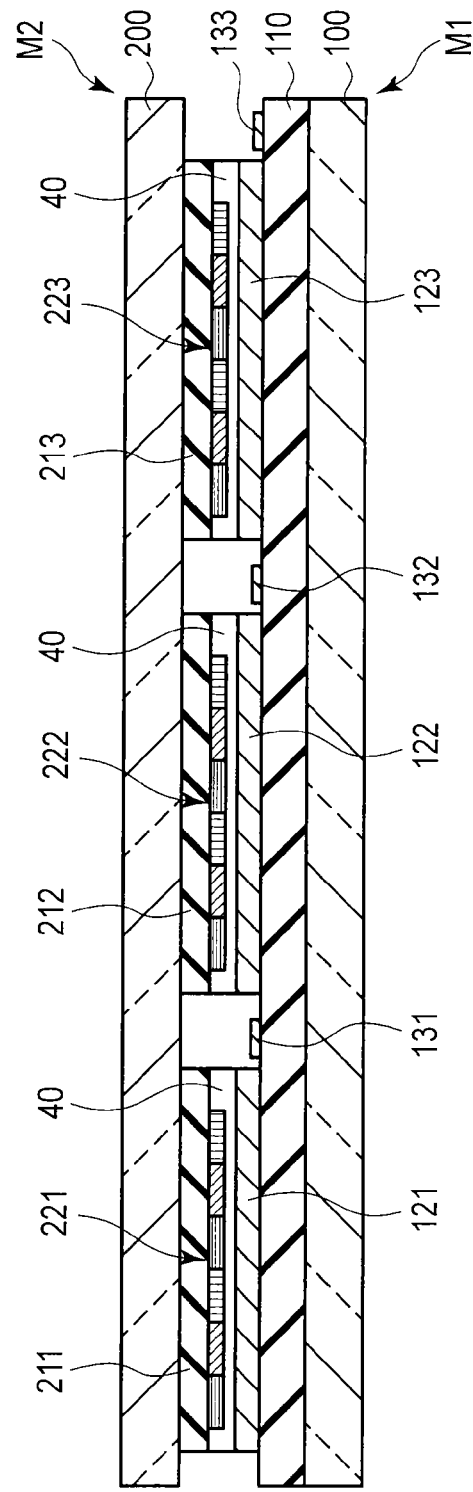
FIG. 5 is a view for describing the method of manufacturing the display device shown in FIG. 1, FIG. 5 illustrating a step of attaching the first mother substrate and the second mother substrate.

Subsequently, as illustrated in FIG. 5, the first mother substrate M1 and second mother substrate M2 are attached. Specifically, the display element module 121 and color filter layer 221 are attached by the adhesive 40, the display element module 122 and color filter layer 222 are attached by the adhesive 40, and the display element module 123 and color filter layer 223 are attached by the adhesive 40.

Following the above, as illustrated in FIG. 6, as regards the second mother substrate M2, the glass substrate 200 is peeled from the peeling auxiliary layers 211 to 213, and the glass substrate 200 is removed. Specifically, as regards the second mother substrate M2, a laser beam is radiated on the peeling auxiliary layers 211 to 213 from the glass substrate 200 side, thereby separating the glass substrate 200 from the peeling auxiliary layers 211 to 213. At this time, as the light source, use can be made of a light source or a heat source which exhibits local energy absorption at an interface between the glass substrate 200 and the peeling auxiliary layers 211 to 213. In this example, an excimer laser device was used. Thereby, the color filer layers 221 to 223, which are attached by the adhesive 40, and the peeling auxiliary layers 211 to 213 are left on the first mother substrate $M_1$.

Then, as illustrated in FIG. 7, the first mother substrate $M_1$ is cut. In the example illustrated, the first mother substrate M1 is cut between the first region A1 and second region A2 (more specifically, between the mounting portion 131 and the display element module 122) and between the second region A2 and third region A3 (more specifically, between the mounting portion 132 and the display element module 123). At this time, the glass substrate 100 and peeling auxiliary layer 110 are cut batchwise. Such cutting of the first mother substrate $M_1$ was carried out by, for example, laser beam irradiation from a CW carbon dioxide laser. Thereby, the first mother substrate $M_1$ is separated into a chip C1 including the display element module 121 in the first area A1 and including the mounting portion 131, a chip C2 including the display element module 122 in the second area A2 and including the mounting portion 132, and a chip C3 including the display element module 123 in the third area A3 and including the mounting portion 133.

Subsequently, as illustrated in FIG. 8, as regards the separated chip C1, a signal supply source 300 is mounted on the mounting portion 131. At this time, since the glass substrate 100 is left, it is possible to secure a support strength enough to receive a pressing force which is applied at the time of mounting the signal supply source 300, and it is possible to prevent deformation of the chip C1 or a defect in mounting. Although not illustrated, signal supply sources are also mounted on the mounting portion 132 of the chip C2 and the mounting portion 133 of the chip C3.

Following the above, as illustrated in FIG. 9, as regards each chip, the glass substrate 100 is peeled from the peeling auxiliary layer 110, and the glass substrate 100 is removed. Specifically, a laser beam is radiated on the peeling auxiliary layer 110 from the glass substrate 100 side, thereby separating the glass substrate 100 from the peeling auxiliary layer 110. At this time, an excimer laser device was used as the light source, like the case described with reference to FIG. 6.

Thereby, the organic EL display device 1 of the embodiment is manufactured.

According to the above-described embodiment, in the second mother substrate M2, each of the peeling auxiliary layers 211 to 213 is patterned to have the same size as the resin substrate 30 of the organic EL display device that is the final product. The color filter layers 221 to 223 are formed on the peeling auxiliary layers 211 to 213, and the resultant structure is attached to the first mother substrate M1. Then, the glass substrate 200 is peeled from the second mother substrate M2. Thereby, the step of cutting the second mother substrate M2 can be omitted. Thus, a cutting process at a position above the mounting portions 131 to 133 can be avoided. Therefore, productivity can be improved.

In particular, when the peeling auxiliary layers 211 to 213 are formed, a photolithography technique in a color filter process or a TFT array process is used. Thereby, the peeling auxiliary layers 211 to 213 can be patterned with fineness and precision that are several hundred times or more higher than in the case of a punching process by a Thomson blade.

In addition, since the resin substrate 10 (or the peeling auxiliary layer 110, or peeling auxiliary layers 111 to 113) is formed of polyimide with excellent heat resistance, it is possible to secure the precision in dimension of the TFT array (including various insulation films, switching elements and wirings) and organic EL elements which are formed on the resin substrate 10. In particular, in the structure using the resin substrate 10 with a thickness of 5 to 30 μm, when the TFT array is fabricated, it is possible to utilize, with little alteration, the equipment which is used in the production line of active-matrix-type liquid crystal display panels. Therefore, it is possible to reduce the production cost, and it becomes easy to secure productivity, for example, by taking over the mass-production technology of liquid crystal display panels.

In addition, with the structure using the resin substrate 10, compared to a display device using a glass substrate, the reduction in thickness and weight is possible, and flexibility is high and the degree of freedom in shaping is high. Although the resin substrate 10 has a relatively high moisture-absorption property, the entrance of moisture via the resin substrate 10 can be suppressed since the inner surface 10A of the resin substrate 10 is covered with the first insulation film 11 that is the inner surface barrier film. Thereby, deterioration due to moisture of the organic light emission layer ORG can be suppressed, and degradation in display quality due to occurrence of dark spots can be suppressed.

Next, another method of manufacturing the organic EL display device 1 in the embodiment is briefly described. A description of parts common to the above-described manufacturing method is omitted.

To begin with, as illustrated in FIG. 10, a first mother substrate $M_1$ is prepared. Specifically, peeling auxiliary layers 111 to 113 are formed on a glass substrate 100. The peeling auxiliary layers 111 to 113 correspond to the above-described resin substrate 10. The peeling auxiliary layers 111 to 113 are formed in the first region A1, second region A2 and third region A3, and are spaced apart from each other. Specifically, each of the peeling auxiliary layers 111 to 113 is formed in an island shape on the glass substrate 100.

A display element module 121 and a mounting portion 131 are formed on the peeling auxiliary layer 111. A display element module 122 and a mounting portion 132 are formed on the peeling auxiliary layer 112. A display element module 123 and a mounting portion 133 are formed on the peeling auxiliary layer 113.

On the other hand, a second mother substrate M2 as shown in FIG. 3 and FIG. 4 is prepared.

Figure 11:
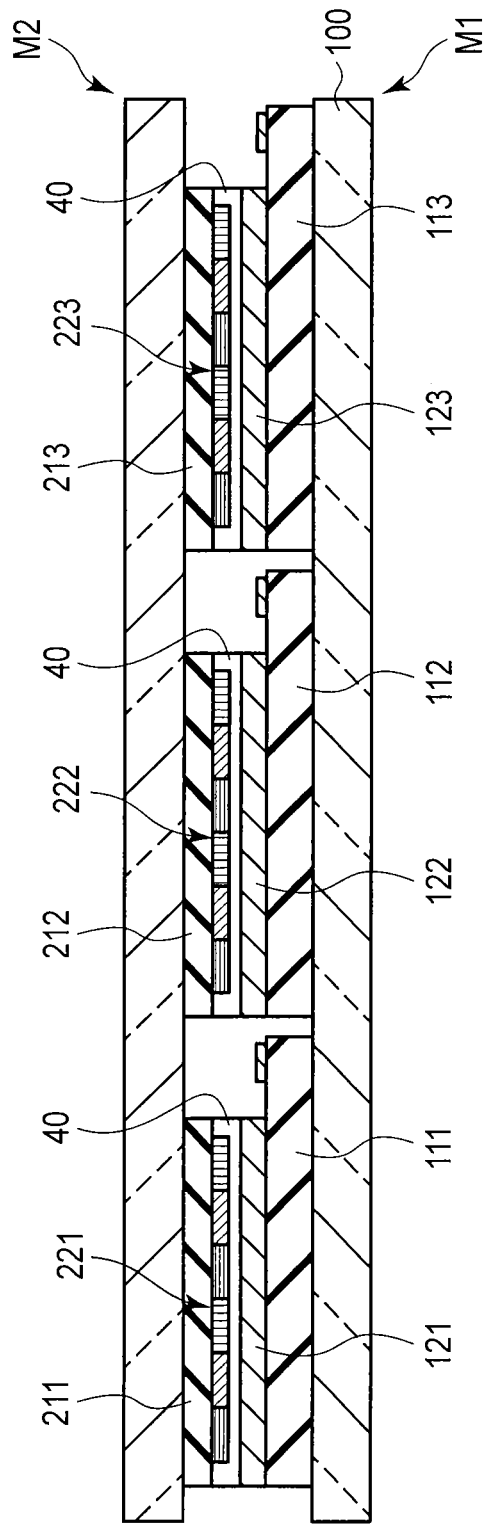
FIG. 11 is a view for describing the another method of manufacturing the display device shown in FIG. 1, FIG. 11 illustrating a step of attaching the first mother substrate and a second mother substrate.

Subsequently, as illustrated in FIG. 11, the first mother substrate M₁ and second mother substrate M2 are attached. Specifically, the display element module 121 and color filter layer 221 are attached by an adhesive 40, the display element module 122 and color filter layer 222 are attached by the adhesive 40, and the display element module 123 and color filter layer 223 are attached by the adhesive 40.

Figure 12:
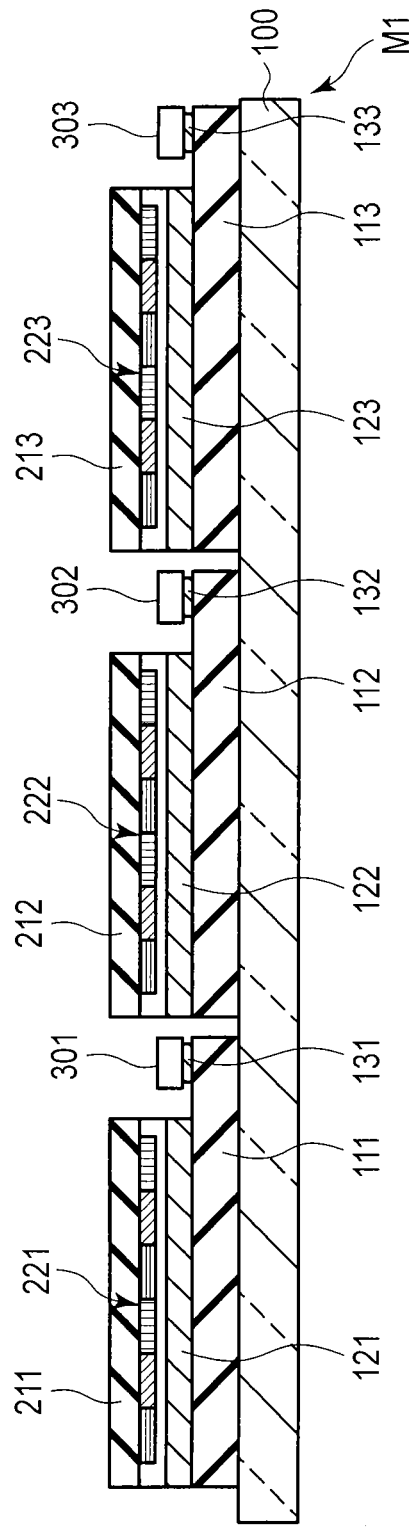
FIG. 12 is a view for describing the another method of manufacturing the display device shown in FIG. 1, FIG. 12 illustrating a step of peeling a glass substrate of the second mother substrate.

Then, as illustrated in FIG. 12, as regards the second mother substrate M2, the glass substrate 200 is peeled from the peeling auxiliary layers 211 to 213, and the glass substrate 200 is removed. Specifically, a laser beam is radiated on the peeling auxiliary layers 211 to 213 from the glass substrate 200 side, thereby separating the glass substrate 200 from the peeling auxiliary layers 211 to 213. Then, a signal supply source 301 is mounted on the mounting portion 131, a signal supply source 302 is mounted on the mounting portion 132, and a signal supply source 303 is mounted on the mounting portion 133. At this time, since the glass substrate 100 is left in the first mother substrate M₁, it is possible to secure a support strength enough to receive a pressing force which is applied at the time of mounting each of the signal supply sources 301 to 303, and it is possible to prevent a defect in mounting.

Following the above, as illustrated in FIG. 13, as regards the first mother substrate M₁, the glass substrate 100 is peeled from the peeling auxiliary layers 111 to 113, and the glass substrate 100 is removed. Specifically, a laser beam is radiated on the peeling auxiliary layers 111 to 113 from the glass substrate 100 side, thereby separating the glass substrate 100 from the peeling auxiliary layers 111 to 113.

Thereby, the organic EL display device 1 of the embodiment is manufactured.

In this manufacturing method, compared to the above-described manufacturing method, the step of cutting the first mother substrate M1 is needless. Thus, the productivity can further be improved.

As has been described above, according to the present embodiment, a method of manufacturing a display device, which can improve productivity, can be provided.

In the above-described embodiment, as an example of the display device, the organic EL display device has been described. However, another example of the display device may be a liquid crystal display device. In this case, the display device is configured to include a pixel electrode in place of the anode, which is connected to a switching element, a common electrode in place of the cathode, and a liquid crystal layer including liquid crystal molecules in place of the organic light emission layer. Light, which passes through the liquid crystal layer, is modulated by switching the liquid crystal molecules by an electric field between the pixel electrode and common electrode (counter-electrode).

In the above-described embodiment, the array substrate AR is formed by using the resin substrate 10. Alternatively, the array substrate AR may be formed by using a glass substrate. In this case, the peeling auxiliary layer 110 as described with reference to FIG. 2 is needless, and the display element modules 121 to 123 and mounting portions 131 to 133 may be formed on the glass substrate 100. Specifically, the glass substrate 100 corresponds to the glass substrate which constitutes the array substrate AR. According to this structure, when the first mother substrate M1 described with reference to FIG. 7 is cut, the glass substrate 100 can be cut without being affected by the peeling auxiliary layer 110 that is the resin layer, and the step of peeling the glass substrate 100 from the peeling auxiliary layer 110, as described with reference to FIG. 9, is also needless.

In the embodiment, the above-described laser ablation technique is applied to the peeling between the glass substrate 100 and peeling auxiliary layer 110, the peeling between the glass substrate 100 and peeling auxiliary layers 111 to 113, and the peeling between the glass substrate 200 and peeling auxiliary layers 211 to 213. Alternatively, other techniques, such as a thermal rapid anneal technique, are applicable.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a display device, comprising:
preparing a first substrate configured such that a first display element module comprising a plurality of display elements is formed in a first region on a first glass substrate and a second display element module comprising a plurality of display elements is formed in a second region on the first glass substrate, the second region being spaced apart from the first region;
preparing a second substrate configured such that a first peeling auxiliary layer having an island shape is formed on a second glass substrate, a second peeling auxiliary layer having an island shape, which is spaced apart from the first peeling auxiliary layer, is formed on the second glass substrate, and then a first color filter layer is formed on the first peeling auxiliary layer and a second color filter layer is formed on the second peeling auxiliary layer;
attaching the first display element module and the first color filter layer, and attaching the second display element module and the second color filter layer;
peeling the second glass substrate from the first peeling auxiliary layer and the second peeling auxiliary layer by radiating a laser beam toward the second substrate; and
cutting the first substrate between the first region and the second region.

2. The method of claim 1, wherein said preparing the first substrate includes forming a third peeling auxiliary layer over the first region and the second region on the first glass substrate, and then forming the first display element module and the second display element module on the third peeling auxiliary layer.

3. The method of claim 2, further comprising, after said cutting the first substrate, peeling the first glass substrate from the third peeling auxiliary layer by radiating a laser beam toward the first substrate of the first region, and peeling the first glass substrate from the third peeling auxiliary layer by radiating a laser beam toward the first substrate of the second region.

4. The method of claim 2, wherein the first display element module and the second display element module include an inner surface barrier film between the third peeling auxiliary layer and the display elements.

5. The method of claim 1, wherein the first peeling auxiliary layer and the second peeling auxiliary layer are transparent.

6. The method of claim 1, wherein the first peeling auxiliary layer and the second peeling auxiliary layer are formed of a material consisting mainly of polyimide.

7. The method of claim 1, wherein the first peeling auxiliary layer and the second peeling auxiliary layer have tapered end faces.

* * * * *